United States Patent [19]

Izumi et al.

[11] 4,400,691
[45] Aug. 23, 1983

[54] ANALOG-TO-DIGITAL CONVERTER FOR CAMERAS

[75] Inventors: Shuji Izumi, Sakai; Masayoshi Sahara, Sennan; Masaaki Nakai, Nara, all of Japan

[73] Assignee: Minolta Camera Kabushiki Kaisha, Osaka, Japan

[21] Appl. No.: 289,375

[22] Filed: Aug. 3, 1981

[30] Foreign Application Priority Data

Sep. 1, 1980 [JP] Japan ................................. 55-121667

[51] Int. Cl.³ .......................................... H03K 13/02
[52] U.S. Cl. .......................... 340/347 AD; 354/23 D
[58] Field of Search ................... 340/347 AD, 347 M; 364/602, 603, 604, 606; 354/23 D

[56] References Cited

U.S. PATENT DOCUMENTS

| | | | |
|---|---|---|---|
| 2,997,704 | 8/1961 | Gordon | 364/602 |
| 3,614,772 | 10/1971 | Paine | 340/347 AD |
| 3,795,900 | 3/1974 | Monford | 340/347 AD |
| 3,997,905 | 12/1976 | Iwata | 354/23 D |
| 4,061,431 | 12/1977 | Toyoda | 354/23 D |
| 4,184,151 | 1/1980 | Iwata | 354/23 D |

*Primary Examiner*—C. D. Miller
*Attorney, Agent, or Firm*—Watson, Cole, Grindle & Watson

[57] ABSTRACT

An analog-to-digital converter for cameras generates a digital output signal representing the difference between a pair of analog input signals by converting a generated variable digital signal into a variable analog signal, combining a first analog input signal with the variable analog signal to provide a calculated analog signal and comparing the calculated analog signal with a second analog input signal to determine whether or not such signals have a predetermined relationship with respect to one another such that the variable digital signal is fixed when the aforementioned predetermined relationship is determined to exist.

10 Claims, 7 Drawing Figures

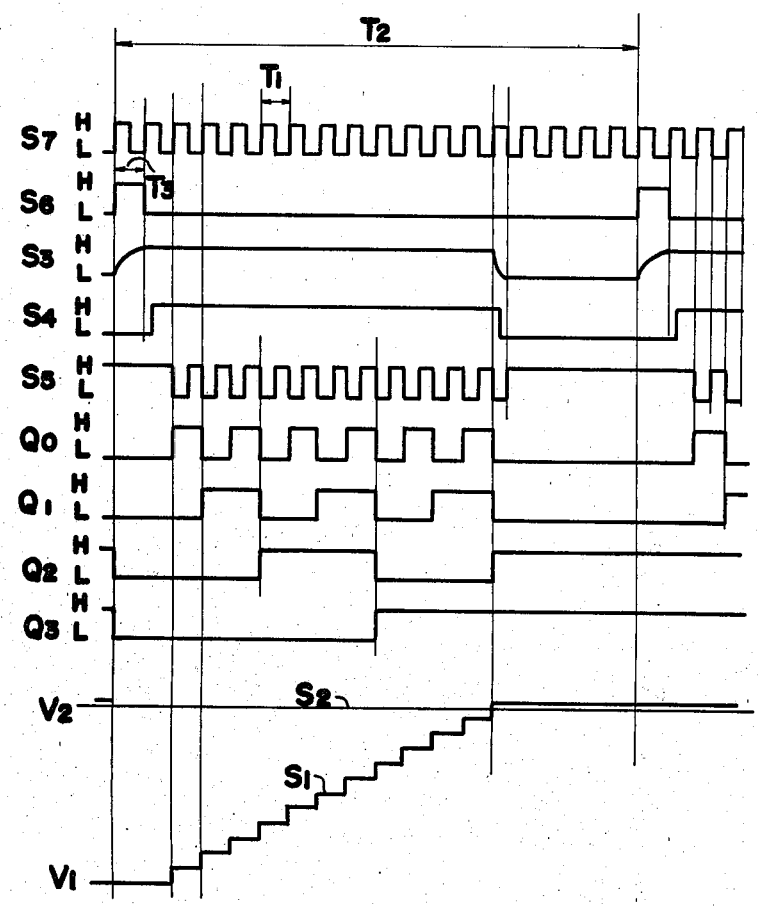

ANALOG-TO-DIGITAL CONVERTER FOR CAMERAS

BACKGROUND OF THE INVENTION

1. Field of the Invention

The present invention relates to an analog-to-digital converter for use in cameras.

2. Description of the Prior Art

In camera circuits, various analog signals are generated and required to be converted into digital signals for digital indication of the exposure information or for digital exposure control. For example, an analog signal representative of the scene brightness is generated by a light measuring circuit. Such an analog signal, however, generally includes an undesirable factor caused by the difference in individual characteristics of the elements used in the circuit, such as the photosensitive element or logarithmic conversion element, the undesirable factor affecting the transmission of the true light measuring signal. Therefore, it is necessary to eliminate the undesirable factor from the analog signal generated from the light measuring circuit. For this purpose, a method is available in which an adjustable analog signal is generated and a subtraction between the analog signal of the light measuring circuit and the adjustable analog signal is carried out. Thus, a digital signal corresponding to the difference between the two analog signals is obtained with the undesirable factor eliminated.

As is exemplified above, in the camera circuit for digitally indicating an exposure information or for digitally controlling the exposure, a digital signal corresponding to the difference between two analog signals is frequently required. For this purpose, it is possible to provide an analog subtraction circuit for processing the two analog signals and a conventional A/D converter for converting the output analog signal from the analog subtraction circuit into the desired digital signal. Alternatively, the final digital signal may be obtainable by means of converting each of the two analog signals into corresponding two digital signals through a conventional A/D converter, and then processing the two digital signals through a digital subtraction circuit.

In any case, however, it has been necessary to use a subtraction circuit or the like in addition to the A/D converter.

The present invention can be distinguished from such prior art by considering FIG. 1 which represents an example of the prior art conventional A/D converter. In FIG. 1, transistors 102 and 104 and constant current source 106 constitute a constant voltage source to generate an output voltage corresponding to the base-to-emitter voltage $V_{BE}$ of transistor 102 at junction 110 between the base of transistor 102 and resistor 108. Between junction 110 and ground, there is connected a series circuit formed by resistor 108 and variable current source 112, which is controlled so as to generate a current corresponding to a digital output of counter 126. The change in current of variable current source 112 causes a change in the voltage level at junction 114 between resistor 108 and variable current source 112, junction 114 being connected to one terminal 118 of comparator 116. An analog signal to be converted into a digital signal is connected to the other terminal 120 of comparator 116. Comparator 116 inverts its output from "high" to "low" when the level of terminal 118 becomes lower than the level of terminal 120. Gate 124 transmits the pulses from clock pulse generator 122 to counter 126 until the output of comparator 116 is inverted from "high" to "low". Thus, the digital signal contained in counter 126 upon termination of pulse counting caused by gate 124 blocking the transmission of pulses corresponds to the analog signal at terminal 120, since the pulse counting is blocked when the level of junction 114 reaches the level of the analog signal in response to the current of variable current source 112 controlled by counter 126. After the A/D conversion is completed in the above manner, the result is digitally indicated by indicator 128.

In the prior art, U.S. Pat. No. 4,118,712 discloses an A/D converter designed to function in the manner described above.

SUMMARY OF THE INVENTION

An object of the present invention is to provide a camera with an analog-to-digital converter for generating, in response to a pair of analog input signals, a digital output signal corresponding to the difference between the pair of analog input signals.

Another object of the present invention is to provide an analog-to-digital converter for obtaining a digital signal corresponding to the difference between a pair of analog signals without the necessity of a subtraction circuit or equivalent circuit.

Still another object of the present invention is to provide an analog-to-digital converter of the above-mentioned type suitable for design as an integrated circuit.

A further object of the present invention is to provide an analog-to-digital converter of the above-mentioned type capable of accurately responding to an analog input signal regardless of the output impedance of the source of the analog signal connected to the analog-to-digital converter.

In accordance with one embodiment of the invention, a variable digital signal is generated and converted into a variable analog signal. A first analog input signal is arithmetically combined with the variable analog signal to provide a calculated analog signal output. A second analog input signal is compared with the calculated analog signal to determine whether or not a predetermined relationship exists between the two signals. When the comparison determines that such a predetermined relationship exists, the variable digital signal is fixed so as to be representative of the difference between the first and second analog input signals.

The converting circuitry includes a circuit for generating a variable current in accordance with the variable digital signal and a resistor is connected to the variable current source to conduct the variable current. A voltage representative of the first analog signal is then added to a voltage appearing across the resistor. The variable current source may also comprise a pair of current sources each connected to a respective opposite terminal of the resistor.

In modified embodiments of the invention, the converting circuitry includes a current mirror circuit and a current source connected to a resistor for producing a voltage corresponding to the variable digital signal. The first analog input signal and the variable analog signal may be added using a first transistor connected between a first terminal of the current mirror circuit and the current source and a second transistor connected between a second terminal of the current mirror circuit and the resistor, with the resistor being inserted between the emitters of the first and second transistors. The first analog input signal is then applied to the base of the first transistor with the base of the second transistor being connected to a voltage comparator.

A timing circuit controls a fixing circuit to prevent the digital signal from being varied. The variable digital signal is stored in a register and the content of the register is prevented from being changed to fix the variable digital signal when the comparing circuit determines the existence of the aforementioned predetermined relationship.

BRIEF DESCRIPTION OF THE DRAWINGS

The above objects, features and advantages of the invention are apparent from the following description of preferred embodiments representing the best mode of carrying out the invention when such description is taken in conjunction with the following drawings, wherein:

FIG. 7 is a time chart explaining the function of the third embodiment.

DETAILED DESCRIPTION OF THE PREFERRED EMBODIMENTS

Figure 2:
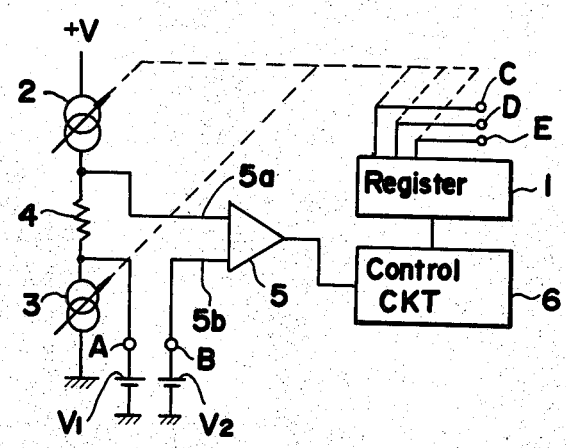
FIG. 2 represents a circuit diagram of a first embodiment of the present invention.

FIG. 2 is a view of a first embodiment illustrating the operating principle of an A/D converter according to the present invention. The A/D converter of the present invention is adapted to output a digital signal at output terminals C, D and E of a register 1, the digital output signal being indicative of the potential difference $v2-v1$ between first and second analog input voltages $v1$ and $v2$ applied to input terminals A and B. The A/D converter will now be described in further detail with respect to its implementation and operation. Register 1 functions to supply the digital signal to output terminals C, D and E and to current sources 2 and 3 as detailed below under control of control circuit 6. It is noted that the digital signal is simultaneously output by means of parallel operation through the plurality of terminals. The first current source 2 feeds an output current corresponding to the digital signal from register 1. A current which corresponds to the digital signal from register 1 and has the same amperage as that of the output current flowing from the first current source flows into second current source 3. Therefore, a voltage appears across resistor 4 which corresponds to the digital signal from register 1, since one end of resistor 4 is connected to an output terminal of first current source 2 and the other terminal thereof is connected to an input terminal of second current source 3. The remaining terminal of resistor 4 is also connected to terminal A. A first signal source V1 which generates the first analog voltage v1 is connected between terminal A and ground in parallel with the second current source 3. Voltage comparator 5 transmits a signal to control circuit 6 when the voltages at input terminals 5a, 5b of voltage comparator 5 are brought into a predetermined relationship. One of the input terminals 5a is connected to one terminal of resistor 4, and the other input terminal 5b is connected to terminal B. Between terminal B and ground, there is provided second signal source V2 which generates the second analog voltage v2. It is assumed that the analog voltages are respectively applied to the terminals A and B under the condition that $v2>v1$. Control circuit 6 changes the digital signal from register 1 from time to time, and thus varies (for example, increases) the voltage across resistor 4; however, the change in the digital signal from the register 1 is stopped in response to the signal output from voltage comparator 5.

Should the input terminal of voltage comparator 5 exhibit a high input impedance and the input current be negligible in comparison with the output current of first current source 2, all of the output current of first current source 2 can be considered to flow through resistor 4. Since the input current of the second current source 3 is equal to the output current of first current source 2, the entire current flowing through resistor 4 is drawn into second current source 3. Accordingly, neither input current nor output current is required from first analog signal source V1 connected in parallel with second current source 3 so that second current source 3 exhibits a high external impedance. Therefore, whether the output impedance of signal source V1 is high or low, the potential appearing at the remaining terminal of resistor 4 is dependent primarily upon the voltage v1. However, since the current of first and second current sources 2 and 3 correspond to the digital signal from register 1, a voltage corresponding to a digital signal is developed across resistor 4. Thus, applied to one input terminal 5a of voltage comparator 5 is the sum of the first analog voltage v1 and the voltage developed across resistor 4 corresponding to the digital signal from register 1. Voltage comparator 5 compares the summed voltage with second analog voltage v2 applied to the remaining input terminal 5b. If the summed voltage varies (for example, increases) in response to the change in the digital signal from register 1 under control of control circuit 6 and exceeds second analog voltage v2 or goes within a given voltage range in comparison with voltage v2, then voltage comparator 5 supplies a signal to control circuit 6. Upon input of this signal, control circuit 6 stops changing the digital signal of register 1 and thus completes the analog-to-digital conversion. The resultant digital signal in register 1 is the outcome of the analog-to-digital conversion which is effected on the analog potential difference $(v2-v1)$ between the first and second analog voltages v1 and v2.

Figure 3:
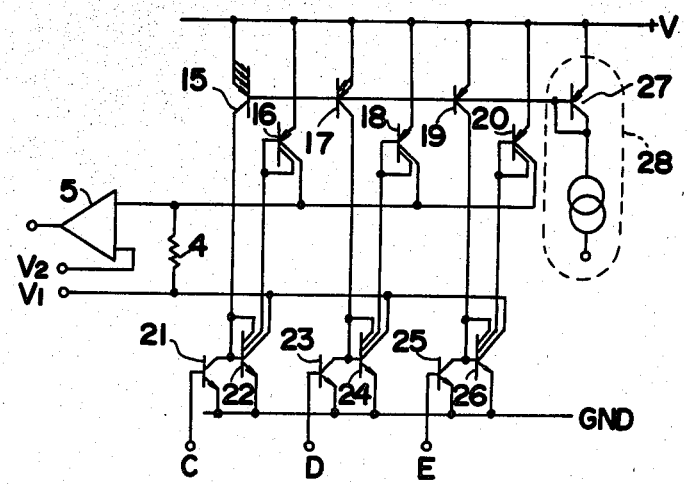
FIG. 3 represents a circuit diagram illustrating a portion of the first embodiment in more detail.

FIG. 3 is a circuit diagram detailing the D/A converter represented by constant current sources 2, 3 and resistor 4 shown in FIG. 2. A subcircuit consisting of a group of transistors 15, 16, 21 and 22, a subcircuit consisting of a group of transistors 17, 18, 23 and 24 and a subcircuit consisting of a group of transistors 19, 20, 25 and 26 are circuits which generate a predetermined amperage of currents in response to the output signals at output terminals C, D and E of register 1 (for example, the amperage of currents being weighted at a ratio of 4:2:1). Thus, the total current flowing through resistor 4 corresponds to the digital signal from register 1. A bias source 28 is designed to create reference current Iref for digital-to-analog conversion and supply the same bias voltage to the bases of transistors 15, 17 and 19 via transistor 27. The emitter areas of transistors 15, 17 and 19 are correlated at a ratio of 4:2:1 with the result that their respective collector currents are 4.Iref, 2.Iref and 1.Iref. Transistors 21, 23 and 25 have the bases thereof respectively connected to output terminals C, D and E of register 1 and the collectors thereof respectively connected to the collectors of transistors 15, 17 and 19. Transistors 22, 24 and 26 are of a multicollector configuration, each having three collectors with the base connected directly to the first collector of the three collectors. The first and second collectors and the first and third collectors of each of transistors 22, 24 and 26, in combination, form respective current mirror circuits and are connected to the collectors of transistors 15, 17 and 19, respectively. Transistors 16, 18 and 20 are of a multicollector configuration having two collectors. The bases of transistors 16, 18 and 20 are connected directly to the first collectors of the respective transistors to thereby form a current mirror circuit. The first collectors of transistors 16, 18 and 20 are connected directly to the second collectors of transistors 22, 24 and 26, respectively. The second collectors of transistors 16, 18 and 20 are connected to one terminal of resistor 4, whereas the third collectors of transistors 22, 24 and 26 are connected to the remaining terminal of resistor 4.

With such an arrangement, the subcircuit including transistors 15, 16, 21 and 22 operates in the following manner. If output terminal C of register 1 is at a "low" level, then transistor 21 is shut off so that the collector current 4.Iref of transistor 15 flows into the first collector of transistor 22. Transistor 22 forms a current mirror circuit with the second and third collectors having a tendency to draw the same current as the above-mentioned collector current flowing into the first collector. These collectors are connected to the first and second collectors of transistor 16 which also forms a current mirror circuit, so that transistors 16 and 22 become conductive to cause the same current 4.Iref to flow therethrough. This current 4.Iref flows through resistor 4 connected between the second collector of transistor 16 and the third collector of transistor 22. If output terminal C of register 1 is at a "high" level, then transistor 21 becomes conductive to absorb the majority of the collector current of transistor 15 and shut off transistor 22. It necessarily follows that transistor 16 is shut off and no current flows through resistor 4.

Provided that the level of the output at terminal C of register 1 is "low" for a signal "1" of the corresponding bit of the digital signal and the level is "high" for a signal "0" of the corresponding bit, a voltage corresponding to the digital signal bit appears across resistor 4. The above operation is common to the other two of the transistor groups, each of which accordingly generates a current flow through resistor 4 in response to the corresponding bit of the digital signal appearing at terminal D or E independently of each other. Since the current through resistor 4 is the sum of the current flows corresponding to the three digital signal bits from the respective transistor groups, the voltage developed across resistor 4 corresponds to a complete digital signal in register 1. As the digital signal in register 1 varies from time to time under control of control circuit 6, the voltage resulting from the corresponding digital-to-analog conversion appears across resistor 4.

Figure 1:
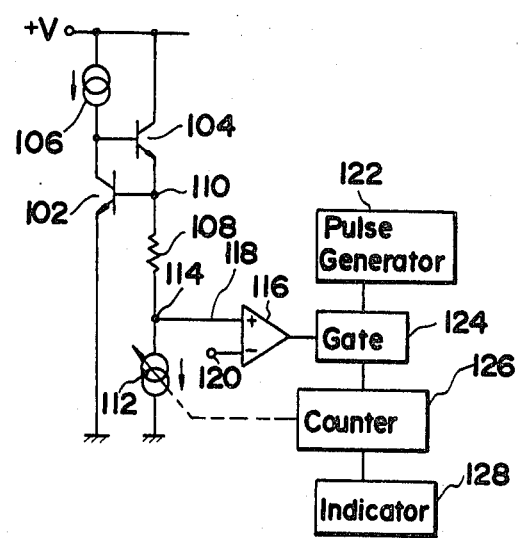
FIG. 1 represents a circuit diagram of a conventional prior art analog-to-digital converter.
Figure 4:
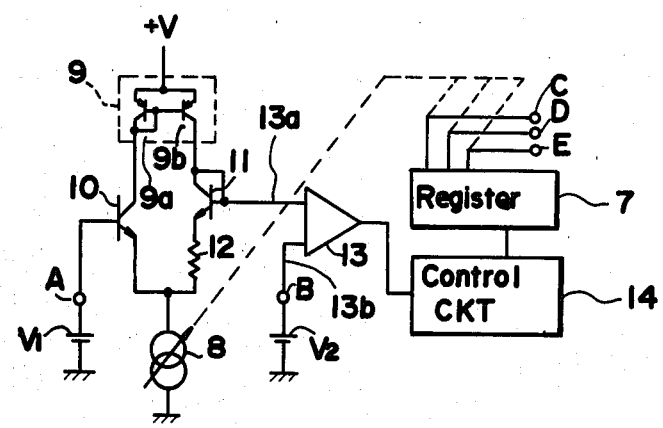
FIG. 4 represents a circuit diagram of a second embodiment of the present invention.

FIG. 4 shows a second embodiment of the present invention, which is a modification of the circuit shown in FIG. 2. There are provided two current flow paths corresponding to the digital signal from register 1, one for receiving first analog voltage v1 via a transistor and the other for delivering the sum voltage v0 via a transistor. Details of the components which are similar to those in FIG. 1 are not discussed below. Register 7 outputs the digital signal at terminals C, D and E. A current corresponding to the digital signal flows into current source 8 under the control of register 7. Current mirror circuit 9 comprises two transistors 9a and 9b with commonly connected emitters and bases. The base-to-collector path of one of the transistors 9a is directly coupled. Transistor 10 has the collector thereof connected to the collector of transistor 9a, the base connected to input terminal A and the emitter connected to an input terminal of current source 8. The short-circuited collector-to-base path of transistor 11 is connected to the collector of transistor 9b and input terminal 13a of voltage comparator 13, and the emitter of transistor 11 is connected to the input terminal of current source 8 through resistor 12. The remaining input terminal 13b of voltage comparator 13 is connected to input terminal B. It is noted that first signal source V1 for generating first analog voltage v1 is connected between terminal A and ground and second signal source V2 for generating second analog voltage v2 is connected between terminal B and ground.

Should the emitter areas of transistors 9a and 9b be equal, the collector currents of transistors 9a and 9b are equal to each other and to one-half of the input current to current source 8. First analog voltage v1 is supplied to the base of transistor 10 and the base current thereof is minute as defined by 1/hFE of the collector current, or the half current, so that the external input impedance of transistor 10 is high. Whether the output impedance of signal source V1 is high or low, the base potential is dependent primarily upon the supply voltage v1 thereof. Where VBE10 is the base-to-emitter voltage as determined by the current flowing through transistor 10, the potential appearing at the input terminal of current source 8 or the lower terminal of resistor 12 is v1−VBE10. Furthermore, where vR is the voltage appearing across resistor 12 due to the current therethrough and VBE11 is the base-to-emitter voltage as determined by the current flowing through transistor 11, the base potential of transistor 11, or the input voltage v0 to input terminal 13a of voltage comparator 13 can be represented by $$v0 = v1 - VBE10 + vR + VBE11$$

assuming that transistors 10 and 11 have the same characteristics,

VBE10 = VBE11. Therefore, $$v0 = v1 + vR.$$

It is clear from the foregoing that the sum of first analog voltage v1 and the voltage vR developed across resistor 12 in accordance with the digital signal from register 7 is supplied to input terminal 13a of voltage comparator 13. Voltage comparator 13 compares the sum voltage with second analog voltage v2 at terminal 13b. If the sum voltage varies (for example, increases) with continuous variations in the digital signal from register 7 under control of control circuit 14 and exceeds second analog voltage v2, or goes within a given voltage range with regard to second analog voltage v2, then voltage comparator 13 supplies a signal to control circuit 14. Upon receipt of this signal, control circuit 14 interrupts any variations in the digital signal from register 7 and completes the analog-to-digital conversion. The resultant digital signal in register 7 is the outcome of the analog-to-digital conversion which is effected on the potential difference v2−v1 between first and second analog voltages v1 and v2.

Figure 5:
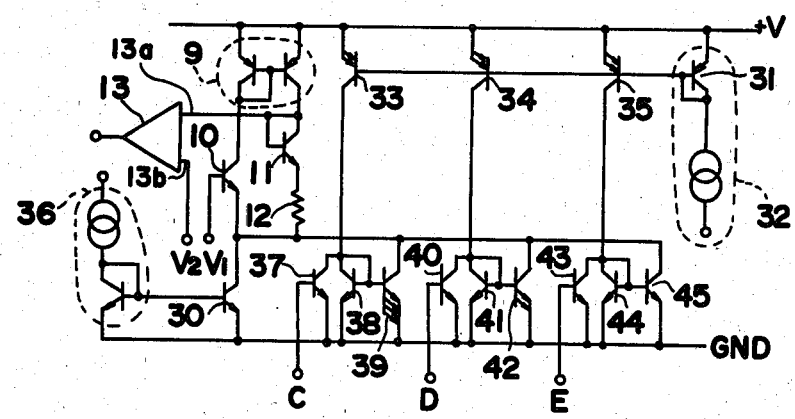
FIG. 5 represents a circuit diagram illustrating a portion of the second embodiment in more detail.

FIG. 5 is a circuit diagram detailing the D/A converter component represented by constant current source 8, current mirror circuit 9, transistor 11 and resistor 12, shown in FIG. 4. A subcircuit consisting of a group of transistors 33, 37, 38 and 39, a subcircuit consisting of a group of transistors 34, 40, 41 and 42 and a subcircuit consisting of a group of transistors 35, 43, 44 and 45 are circuits which generate current corresponding to the three bit digital signal from output terminals C, D and E of the register 7 (for example, weighted at a ratio of 4:2:1). Bias source 32 is designed to create reference current Iref for digital-to-analog conversion and supply the same bias voltage to the bases of transistors 33, 34 and 35 via transistor 31. The emitter areas of transistors 33, 34 and 35 are correlated at a ratio of 2:1 with regard to that of transistor 31 with the result that the collector current thereof are each 2.Iref. Transistors 37, 40 and 43 have the bases thereof connected to output terminals C, D and E of register 7 and the collectors thereof connected to the collectors of transistors 33, 34 and 35, respectively. Transistors 38, 41 and 44 have directly coupled collector-to-base paths and collectors connected to the collectors of transistors 33, 34 and 35. Three pairs of transistors 38 and 39, 41 and 42, and 44 and 45, respectively, form current mirror circuits with commonly connected bases. The emitter areas of these three pairs of transistors are correlated at a ratio of 4:1, 2:1 and 1:1, respectively. Additionally, the collectors of transistors 39, 42 and 45 are respectively connected to the junction between the emitter of transistor 10 and the lower terminal of resistor 12 to draw current from current mirror circuit 9. Bias source 36 is designed to supply bias current IB to the aforementioned junction by continuously drawing constant current through transistor 30. The bias current is intended to overcome the following disadvantage. Namely, without such a bias current, although transistor 10, which receives at the base thereof first analog voltage v1, is conductive and the potential at the lower terminal of resistor 12 is settled and fixed automatically depending upon first analog voltage v1 as long as at least one of transistors 39, 42 or 45 is conductive, the potential at the lower terminal of resistor 12 would be unstable when transistors 39, 42 and 45 are shut off and transistor 10 is also shut off.

With such an arrangement, the subcircuit including transistors 33, 37, 38 and 39 operates in the following manner. If terminal C of register 7 is at a "low" level, then transistor 37 is shut off so that the collector current 2.Iref of transistor 33 flows into transistor 38. Since transistors 38 and 39 form the current mirror circuit with an emitter area ratio of 1:4, the collector of transistor 39 in this case has a tendency to draw a current of 8.Iref from current mirror circuit 9. Current mirror circuit 9, however, is already driven with constant current flowing through transistor 30 controlled by bias source 36. Thus, current mirror circuit 9 supplies the sum of the collector current (I0=8.Iref) from transistor 39 and the bias current IB of transistor 30 in response to the conduction of transistor 39. Since current mirror circuit 9 is designed to provide two current flow outputs with the same amperage via two collectors, one-half of the sum current, that is, ½(8 Iref+IB) each flows into transistors 10 and 11, one of which then flows into resistor 12. Where the ratio of the emitter areas of transistors 10 and 11 is 1:2 and R is the resistance of resistor 12, voltage v0 applied to input terminal 13a of voltage comparator 13 can be represented by $$v0 = v1 - \frac{kT}{q} \ln \frac{I0 + IB}{2 \times ICO} + R \frac{I0 + IB}{2} +$$

$$\frac{kT}{q} \ln \frac{I0 + IB}{2 \times 2ICO}$$

$$= v1 + \frac{R \times I0}{2} + \frac{R \times IB}{2} - \frac{kT}{q} \ln 2$$

where k is the Boltzmann constant, T is the absolute temperature, q is the quantity of charge of an electron, ICO is the reverse saturation current of a transistor.

Provided that constant current IB through transistor 30 is designed to fulfill the following equation $$IB = \frac{2}{R} \frac{kT}{q} \ln 2,$$

$$v0 = v1 + R \frac{I0}{2}$$

$$= v1 + 4 R \, Iref.$$

As is clear from the foregoing equations, the bias current IB through bias source 36 has no effect on digital-to-analog conversion. It is noted that the bias current may be adjusted to compensate for deviations in the circuit components from the designed values, for example, the current ratio of the current mirror circuit, or the base-to-emitter voltages (VBE) of transistors 10 and 11. The adjustment of the bias current may also serve as an offset adjustment of voltage comparator 5.

Figure 6:
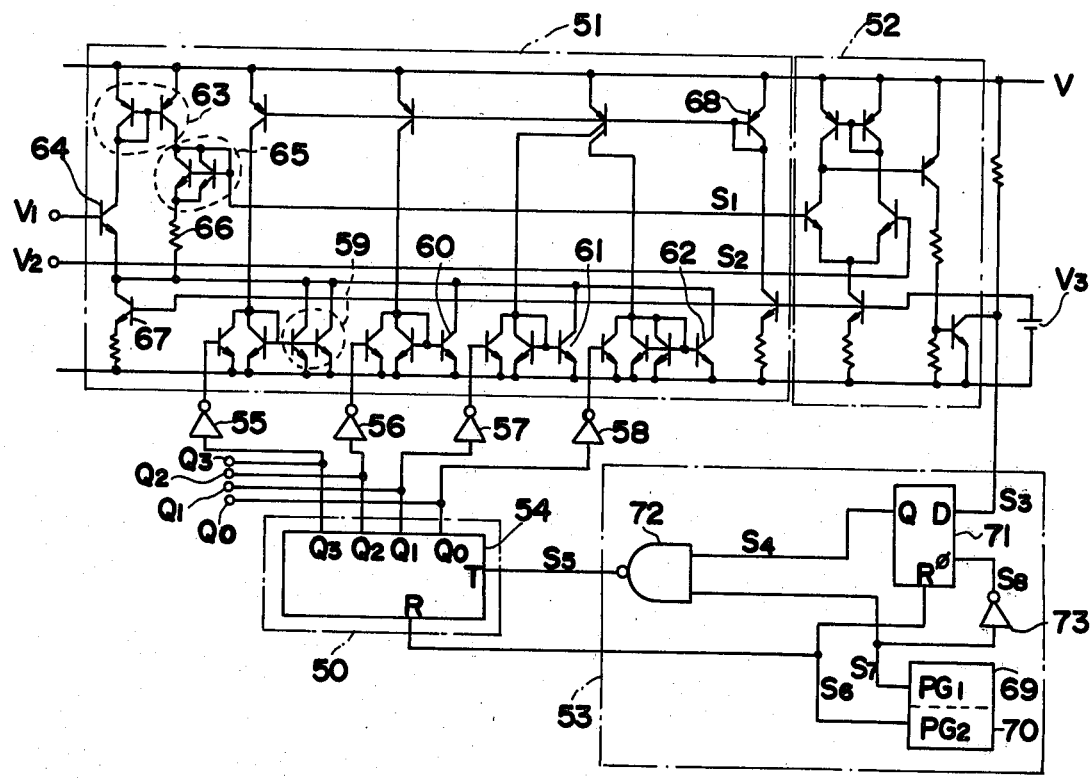
FIG. 6 represents a circuit diagram of a third embodiment of the present invention.

FIG. 6 is a circuit diagram of a third embodiment showing an example of the entire configuration of the A/D converter according to the present invention, and FIG. 7 is a time chart therefor. Register 50 is implemented with counter 54 which counts input pulses and supplies the counted pulses in the form of four bits of digital information through output terminals Q0, Q1, Q2 and Q3 in parallel fashion. This digital signal is fed to D/A converter section 51 via inverters 55, 56, 57 and 58. D/A converter section 51 is basically the same as that in FIG. 5 except that the digital signal is four bits, the levels of these bits are inverted, and the transistors forming the current paths for digital-to-analog conversion are of a different configuration. The ratio of the currents weighted in correspondence with terminals Q0, Q1, Q2 and Q3 and drawn from current mirror circuit 63 by transistors 59, 60, 61 and 62 is 8:4:2:1. Although not shown in detail, constant current bias source v3 is provided to drive transistors 67 and 68 with constant current.

Voltage comparator 52 is of a well-known comparator configuration which compares the sum signal S1 of first analog voltage v1 and a voltage appearing across resistor 66 in accordance with the digital signal from register 50 with a signal S2 corresponding to second analog voltage v2, and provides signal S3 which is to be changed from a "low" to "high" level if S1>S2. Control circuit 53 comprises two pulse generators 69 and 70, D-flip-flop 71, NAND gate 72 and delay circuit 73. Pulse generator 69 is adapted to generate pulses of a repetition period T1 as depicted by S7 in FIG. 7, supplying trigger signals to counter 54 via NAND gate 72 and clock signals to D-flip-flop 71 via delay circuit 73. Delay circuit 73 prevents erroneous operation of flip-flop 71 due to noise occurring within the D/A converter circuit. The noise appears to develop mainly because the switching intervals of the respective transistors in D/A converter section 51 are different so as to disturb the normal digital-to-analog conversion in the course of the switching operations, and under such conditions voltage comparator 52 would provide an erroneous signal for the flip-flop. The delay time of delay circuit 73 is therefore selected to be longer than the interval required for all the transistors in D/A converter 51 to complete the switching operation. It is noted that the repetition period T1 of the pulses from pulse generator 69 is sufficiently longer than the delay time.

Flip-flop 71 receives at one input output signal S3 of voltage comparator 52 and provides output signal S4 to the remaining input of NAND gate 72 to control the on and off operation thereof as depicted by signal S5 in FIG. 7. Pulse generator 70 is adapted to generate having a repetition period T2 and width T3 as depicted by signal S6 in FIG. 7, thereby placing counter 54 and D flip-flop 71 into a reset state at the end of every period T2. The necessary time relationships to be satisfied are T2>T3+16 T1 and T3≧T1.

The following is a description of the operation of the FIG. 6 embodiment. Pulse width T3 from pulse generator 70 resets the count of counter 54. Further, the output of D flip-flop 71 is reset to a "low" level to make NAND gate 72 conductive. Subsequent to the reset operation, the pulse output with a period T1 from pulse generator 69 is supplied to counter 54 through NAND gate 72 to initiate counting by counter 54. The digital signal indicative of the count of counter 54 is output in parallel. A voltage which corresponds to the digital signal from counter 54 is developed across resistor 66 in D/A converter circuit 51 and the sum of that voltage and first analog voltage v1 increases stepwise every period T1 as depicted by sum voltage S1 in FIG. 7. As long as sum voltage S1 is lower than the level S2 of second analog voltage v2, the output signal S3 of voltage comparator 52 is "low" and the output of flip-flop 71 is also still "low", so that counter 54 continues counting. Provided that sum voltage S1 exceeds second analog voltage V2, output signal S3 of voltage comparator 52 increases to a "high" level, and the output of flip-flop 71 also increases to a "high" level. NAND gate 72 therefore inhibits pulses S7 of period T1 from entering counter 54 so that the present count thereof remains unchanged until the counter is reset by the pulse from pulse generator 70. The above-mentioned procedure is repeated every period T2. The resulting digital signal in counter 54, indicative of the difference between the two analog voltage signals V1 and V2 is read out after the lapse of a period of time corresponding to 16·T1, but before occurrence of the next reset signal.

It is obvious that the present invention is equally applicable to reverse polarity transistors in the above embodiments to supply the digital signal from the register via the positive polarity of the power supply. The register and the control circuit may be replaced by a logic circuit having parallel outputs and a logic control circuit therefor. Although in the foregoing description the sum of first analog voltage v1 and the voltage originating from the digital-to-analog conversion is compared with second analog voltage v2, another way to compare the difference between second analog voltage v2 and the voltage originating from the digital-to-analog conversion with first analog voltage v1 may be an effective alternative for the purpose of the present invention. Whereas in the embodiments of FIGS. 6 and 7 the register is designed to increment counting in a stepwise manner, the count may be decremented stepwise and in this case the digital signal is retrieved at the moment when the relationship between the two voltages to be compared is reversed. The method for incrementing or decrementing the voltage resulting from the digital-to-analog conversion as stated above is similar to the so-called Counter Ramp A/D converter wherein a digital signal is obtained in accordance with a time period corresponding to an input analog voltage, but the present invention should not be limited thereto. The present invention is also of use when the voltage resulting from the digital-to-analog conversion varies in a non-stepwise manner and comparison is successively conducted beginning with the most significant bit of the register as in the so-called Successive Approximation A/D converter.

It is, therefore, desired that the present invention not be limited to the embodiments specifically described, but that it include all such modifications and variations that would be obvious to those skilled in this art. The scope of our invention should be determined by the equivalents of the various terms as recited in the following annexed claims.

What is claimed is:

1. An analog-to-digital converter for use in cameras comprising:
    means for generating a variable digital signal;
    means for converting said variable digital signal into a variable analog signal, including means for producing a varying current in response to said variable digital signal and a resistor connected to said producing means to connect said varying current, said producing means including a current mirror circuit having first and second terminals and a current source connected to said resistor for producing a current corresponding to said variable digital signal;
    means for receiving an analog input signal;
    means for arithmetically combining said analog input signal and said variable analog signal to provide a calculated analog signal, including means for adding a voltage representative of said analog input signal to a voltage appearing across said resistor, said adding means including a first transistor connected between said first terminal and said current source, a second transistor connected between said second terminal and said resistor, said resistor being located between the emitters of said first and second transistors, and means for connecting said receiving means to the base of said first transistor;
    means for comparing to detect whether or not said calculated analog signal has a predetermined relationship with a reference analog signal, including a voltage comparator for comparing a voltage representative of the reference analog signal with the added voltages, wherein the base of said second transistor is connected to said voltage comparator for comparison with the reference signal; and
    means responsive to said comparing means for fixing said variable digital signal when said comparing means detects said predetermined relationship, whereby said fixed variable digital signal is representative of the final digital output.

2. An analog-to-digital converter for use in cameras comprising:
- means for generating a variable digital signal;
- means for converting said variable digital signal into a variable analog signal, including means for producing a varying current in response to said variable digital signal and a resistor connected to said producing means to conduct said varying current, said producing means including a pair of current sources each connected to a respective terminal of said resistor, the currents from said pair of current sources being equal to each other and corresponding to said variable digital signal;
- means for receiving an analog input signal;
- means for arithmetically combining said analog input signal and said variable analog signal to provide a calculated analog signal, including means for adding a voltage representative of said analog input signal to a voltage appearing across said resistor, said adding means including means for connecting said receiving means to one terminal of said resistor;
- means for comparing to detect whether or not said calculated analog signal has a predetermined relationship with a reference analog signal, including a voltage comparator for comparing a voltage representative of the reference analog signal with the added voltages, wherein the other terminal of said resistor is connected to said voltage comparator for comparison with the reference analog signal; and
- means responsive to said comparing means for fixing said variable digital signal when said comparing means detects said predetermined relationship, whereby said fixed variable digital signal is representative of the final digital output.

3. An analog-to-digital converter for use in cameras for converting the difference between a pair of analog input signals into a digital output signal, comprising:
- means for generating a variable digital signal;
- means for converting said variable digital signal into a variable analog signal;
- first means for receiving a first variable information analog input signal;
- means for arithmetically combining said first input signal and said variable analog signal to provide a calculated analog signal;
- second means for receiving a second variable information analog input signal;
- means for comparing said second analog input signal with said calculated analog signal to detect whether or not said calculated analog signal has a predetermined relationship with said second analog signal;
- means responsive to said comparing means for fixing said variable digital signal when said comparing means detects said predetermined relationship, whereby said fixed variable digital signal is representative of the difference between said first and second analog input signals;
- said converting means includes means for producing a varying current in response to said variable digital signal and a resistor connected to said producing means to conduct said varying current;
- said combining means includes means for adding a voltage representative of said first analog signal to a voltage appearing across said resistor;
- said comparing means including a voltage comparator for comparing a voltage representative of said second analog input signal with the added voltages;
- said producing means including a pair of current sources each connected to a respective terminal of said resistor, the currents from said pair of current source being equal to each other and corresponding to said variable digital signals; and
- said adding means including means for connecting said first receiving means to one terminal of said resistor, the other terminal of said resistor being connected to said voltage comparator for comparison with said second analog input signal received by said second receiving means.

4. An analog-to-digital converter as claimed in claim 3 further comprising timing means for controlling said fixing means to respond to said comparing means during a period within which said variable analog signal is stable between a pair of times of two neighboring variations of said variable digital signal.

5. An analog-to-digital converter as claimed in claim 3, wherein said generating means includes a register and means for successively changing the digital signal in said register, and wherein said fixing means includes means for interrupting said changing means from changing the digital signal when said comparing means detects said predetermined relationship.

6. An analog-to-digital converter as claimed in claim 3 wherein said converting means includes a plurality of means for providing a plurality of predetermined currents weighted in response to corresponding bits of said variable digital signal, means for separately controlling said plurality of means to become effective in response to respective corresponding bits of said variable digital signal, and a resistor for introducing a sum of said weighted currents therethrough, whereby a voltage is generated across said resistor in accordance with the digital signal of said generating means.

7. An analog-to-digital converter for use in cameras for converting the difference between a pair of analog input signals into a digital output signal, comprising:
- means for generating a variable digital signal;
- means for converting said variable digital signal into a variable analog signal;
- first means for receiving a first variable information analog input signal;
- means for arithmetically combining said first input signal and said variable analog signal to provide a calculated analog signal;
- second means for receiving a second variable information analog input signal;
- means for comparing said second analog input signal with said calculated analog signal to detect whether or not said calculated analog signal has a predetermined relationship with said second analog log signal;
- means responsive to said comparing means for fixing said variable digital signal when said comparing means detects said predetermined relationship, whereby said fixed variable digital signal is representative of the difference between said first and second analog input signals;
- said converting means includes means for producing a varying current in response to said variable digital signal and a resistor connected to said producing means to conduct said varying current:

said combining means includes means for adding a voltage representative of said first analog signal to a voltage appearing across said resistor;

said comparing means includes a voltage comparator for comparing a voltage representative of said second analog input signal with the added voltages;

said producing means includes a current mirror circuit having first and second terminals, and a current source connected to said resistor for producing a current corresponding to said variable digital signal; and said adding means includes a first transistor connected between said first terminal and said current source, a second transistor connected between said second terminal and said resistor, said resistor being located between the emitters of said first and second transistors, and means for connecting said first receiving means to the base of said first transistor, the base of said second transistor being connected to said voltage comparator for comparison with said second analog input signal received by said second receiving means.

8. An analog-to-digital converter as claimed in claim 7 further comprising timing means for controlling said fixing means to respond to said comparing means during a period within which said variable analog signal is stable between a pair of times of two neighboring variations of said variable digital signal.

9. An analog-to-digital converter as claimed in claim 7 wherein said generating means includes a register and means for successively changing the digital signal in said register, and wherein said fixing means includes means for interrupting said changing means from changing the digital signal when said comparing means detects said predetermined relationship.

10. An analog-to-digital converter as claimed in claim 7 wherein said converting means includes a plurality of means for providing a plurality of predetermined currents weighted in response to corresponding bits of said variable digital signal, means for separately controlling said plurality of means to become effective in response to respective corresponding bits of said variable digital signal, and a resistor for introducing a sum of said weighted currents therethrough, whereby a voltage is generated across said resistor in accordance with the digital signal of said generating means.

* * * * *